United States Patent
Gan

(10) Patent No.: US 10,222,655 B2
(45) Date of Patent: Mar. 5, 2019

(54) EIGHT-DOMAIN PIXEL STRUCTURE

(71) Applicant: Shenzhen China Star Optoelectronics Technology Co., Ltd., Shenzhen (CN)

(72) Inventor: Qiming Gan, Shenzhen (CN)

(73) Assignee: SHENZHEN CHINA STAR OPTOELECTRONICS SEMICONDUCTOR DISPLAY TECHNOLOGY CO., LTD., Shenzhen, Guangdong (CN)

( * ) Notice: Subject to any disclaimer, the term of this patent is extended or adjusted under 35 U.S.C. 154(b) by 39 days.

(21) Appl. No.: 15/541,472

(22) PCT Filed: May 18, 2017

(86) PCT No.: PCT/CN2017/084950
§ 371 (c)(1),
(2) Date: Jul. 3, 2017

(87) PCT Pub. No.: WO2018/192048
PCT Pub. Date: Oct. 25, 2018

(65) Prior Publication Data
US 2018/0299734 A1    Oct. 18, 2018

(30) Foreign Application Priority Data

Apr. 17, 2017 (CN) .......................... 2017 1 0250578

(51) Int. Cl.
| | |
|---|---|
| *G02F 1/1337* | (2006.01) |
| *G02F 1/1362* | (2006.01) |
| *G02F 1/1335* | (2006.01) |
| *H01L 27/12* | (2006.01) |

(Continued)

(52) U.S. Cl.
CPC ...... *G02F 1/133753* (2013.01); *G02F 1/1393* (2013.01); *G02F 1/133514* (2013.01); *G02F 1/136213* (2013.01); *H01L 27/124* (2013.01); *G02F 2001/13775* (2013.01)

(58) Field of Classification Search
CPC .................................................. G02F 1/133753
See application file for complete search history.

(56) References Cited

U.S. PATENT DOCUMENTS

| | | | | |
|---|---|---|---|---|
| 2016/0291367 | A1* | 10/2016 | Cheng ................... | G02F 1/1368 |
| 2016/0299392 | A1* | 10/2016 | Cheng ............... | G02F 1/133707 |
| 2017/0108723 | A1* | 4/2017 | No ....................... | G02F 1/1368 |

* cited by examiner

*Primary Examiner* — Edmond C Lau
(74) *Attorney, Agent, or Firm* — Leong C. Lei

(57) ABSTRACT

The invention provides an 8-domain pixel structure, comprising: a plurality of sub-pixels arranged in array in LCD panel, each sub-pixel being divided into main and sub areas, a scan line for each sub-pixel row, a data line for each sub-pixel column; comprising: main area TFT, main area storage capacitor, sub area TFT, and sub area storage capacitor; main area storage capacitor formed by first main area storage electrode in main area and corresponding common electrode; sub area storage capacitor formed by sub area storage electrode in sub area with second main area storage electrode in main area and corresponding common electrode, sub area storage electrode and second main area storage electrode electrically connected to each other across scan line. The invention achieves the object of controlling voltage difference ratio between the main and sub areas, and the best common voltage problem areas does not exist.

16 Claims, 3 Drawing Sheets

(51) Int. Cl.
*G02F 1/139* (2006.01)
*G02F 1/137* (2006.01)

EIGHT-DOMAIN PIXEL STRUCTURE

BACKGROUND OF THE INVENTION

1. Field of the Invention

The present invention relates to the field of display, and in particular to an eight-domain (8-domain) pixel structure.

2. The Related Arts

The liquid crystal display (LCD) usually comprises a color filter (CF) substrate, a thin film transistor (TFT) array substrate, and a liquid crystal (LC) layer disposed between the two substrates, with a pixel electrode and a common electrode provided on the facing inner sides of the two substrates. The liquid crystal molecules are controlled by applying a voltage to change the direction to reflect the light from the backlight module to generate the image. The LCD can be categorized as a variety of display modes, such as, twisted nematic (TN) mode, electronically controlled birefringence (ECB) mode, vertical alignment (VA), and so on, wherein VA mode is a popular mode with the advantages of high contrast, wide viewing angle, and no friction alignment. However, due to the use of vertical rotation of liquid crystal, resulting in a relatively large liquid crystal molecules birefringence difference, the VA mode LCD usually shows a color shift problem in large viewing angle.

As the LCD technology progresses, the size of the display grows larger and larger. The known approach to use 4-domain polymer stabilized vertical alignment (PSVA) pixels will make the poor performance in terms of color shift at large viewing angle prominent. To enhance the viewing angle for the panel, the three-transistor 8-domain (3T_8domain) PSVA pixels are gradually applied to the large-size TV panels, so that the liquid crystal molecules in the four domains of the main area (main) and the four domains of the sub area (sub) in the same sub-pixel have different rotation angle, thereby improving the color shift. FIG. 1 shows a schematic view of a circuit diagram of the known 3T pixel structure. The plurality of the sub-pixels is arranged in an array in the LCD panel, and each sub-pixel can be divided into a main (main) and a sub (sub) area, comprising a main area thin film transistor TFT_m, a main area liquid crystal capacitor Clc_m, a main area storage capacitor Cst_m, a sub area thin film transistor TFT_s, a sub area liquid crystal capacitor Clc_s, a sub area storage capacitor Cst_s, and a common thin film transistor TFT_share, a scan line Gate for each of row sub-pixels, and a data line Data for each column of sub-pixels; the main area TFT TFT_m having a gate connected to the scan line Gate, a source/drain connected to the data line Data, and the main area LC capacitor Clc_m and the main area storage capacitor Cst_m connected in parallel between the drain/source and the common electrode A_com (or C_com); the sub area TFT TFT_s having a gate connected to the scan line Gate, a source/drain connected to the data line Data, and the sub area LC capacitor Clc_s and the sub area storage capacitor Cst_s connected in parallel between the drain/source and the common electrode A_com (or C_com); the common TFT TFT_m having a gate connected to the scan line Gate, a source/drain connected respectively to the drain/source of the sub area TFT TFT_s and the common electrode A_com. For those skilled in the field, it is understood that although the common electrode A_com or C_com have different names, but in actual LCD panel, the two usually have the same voltage, and thus can be depicted as common electrode A_com. For TFTs, because the source and the drain have the same characteristics, no specific designation is assigned to the source or the drain in a circuit. In a three-dimensional structure of the LCD panel, the two ends of the LC capacitor and the storage capacitor usually correspond to the pixel electrode (or the storage electrode sharing the same voltage level with the pixel electrode voltage) and common electrode.

The 8-domain pixels have become a trend for large-size TV panel. However, under the high refreshing rate in high definition (HD) TV, the best common voltage (best Vcom) between the main area and the sub area remains an issue for improving flickering. It is imperative to address the issue for the known 3T pixel structure.

SUMMARY OF THE INVENTION

The object of the present invention is to provide an 8-domain pixel structure, to balance the best voltage between the main area and the sub area.

To achieve the above object, the present invention provides an eight-domain (8-domain) pixel structure, comprising: a plurality of sub-pixels arranged in an array in a liquid crystal display (LCD) panel, each sub-pixel being divided into a main area and a sub area, a scan line being disposed for each row of sub-pixels, located between the main area and the sub area, a data line being disposed for each column of sub-pixel; further comprising: a main area thin film transistor (TFT), a main area storage capacitor, a sub area TFT, and a sub area storage capacitor; the main area storage capacitor being formed by a first main area storage electrode in the main area and a corresponding common electrode; the sub area storage capacitor being formed by a sub area storage electrode in the sub area with a second main area storage electrode in the main area and the corresponding common electrode, the sub area storage electrode and the second main area storage electrode being electrically connected to each other across the scan line; the main area TFT having a gate connected to the a scan line, a source/drain connected to the data line, and a drain/source connected to the first main area storage electrode or a pixel electrode of the main area; the sub area TFT having a gate connected to the scan line, a source/drain connected to the data line, and a drain/source connected to the sub area storage electrode or a pixel electrode of the sub area.

According to a preferred embodiment of the present invention, the main area and the sub area correspond to four domains of liquid crystal molecules, respectively.

According to a preferred embodiment of the present invention, the first main area storage electrode is electrically connected to the pixel electrode of the main area through a via.

According to a preferred embodiment of the present invention, the sub area storage electrode is electrically connected to the pixel electrode of the sub area through a via.

According to a preferred embodiment of the present invention, the first main area storage electrode, the sub area storage electrode and the second main area storage electrode are manufactured with a same metal layer.

According to a preferred embodiment of the present invention, the gate of the main area TFT, the gate of the sub area TFT, and the scan line are manufactured with a same metal layer.

According to a preferred embodiment of the present invention, the source and drain of the main area TFT, the source and drain of the sub area TFT, and the data line are manufactured with a same metal layer.

According to a preferred embodiment of the present invention, the pixel electrodes of the main area and the sub area are made of indium-tin-oxide (ITO).

According to a preferred embodiment of the present invention, the pixel is a PSVA pixel.

The present invention also provides an eight-domain (8-domain) pixel structure, comprising: a plurality of sub-pixels arranged in an array in a liquid crystal display (LCD) panel, each sub-pixel being divided into a main area and a sub area, a scan line being disposed for each row of sub-pixels, located between the main area and the sub area, a data line being disposed for each column of sub-pixel; further comprising: a main area thin film transistor (TFT), a main area storage capacitor, a sub area TFT, and a sub area storage capacitor; the main area storage capacitor being formed by a first main area storage electrode in the main area and a corresponding common electrode; the sub area storage capacitor being formed by a sub area storage electrode in the sub area with a second main area storage electrode in the main area and the corresponding common electrode, the sub area storage electrode and the second main area storage electrode being electrically connected to each other across the scan line; the main area TFT having a gate connected to the scan line, a source/drain connected to the data line, and a drain/source connected to the first main area storage electrode or a pixel electrode of the main area; the sub area TFT having a gate connected to the scan line, a source/drain connected to the data line, and a drain/source connected to the sub area storage electrode or a pixel electrode of the sub area;

wherein the main area and the sub area corresponding to four domains of liquid crystal molecules, respectively;

wherein the first main area storage electrode being electrically connected to the pixel electrode of the main area through a via.

Compared to the known techniques, the present invention provides the following advantages: the 8-domain pixel structure provided by the present invention achieves the object of controlling the voltage difference ratio between the main and sub areas by reducing the main area storage capacitor, enlarging the sub area storage capacitor; moreover, without forming a path to common electrode A_com for direct discharge, the problem of best common voltage difference between the main and sub areas does not exist.

BRIEF DESCRIPTION OF THE DRAWINGS

To make the technical solution of the embodiments according to the present invention, a brief description of the drawings that are necessary for the illustration of the embodiments will be given as follows. Apparently, the drawings described below show only example embodiments of the present invention and for those having ordinary skills in the art, other drawings may be easily obtained from these drawings without paying any creative effort. In the drawings.

DETAILED DESCRIPTION OF THE PREFERRED EMBODIMENTS

To further explain the technical means and effect of the present invention, the following refers to embodiments and drawings for detailed description.

Figure 3:
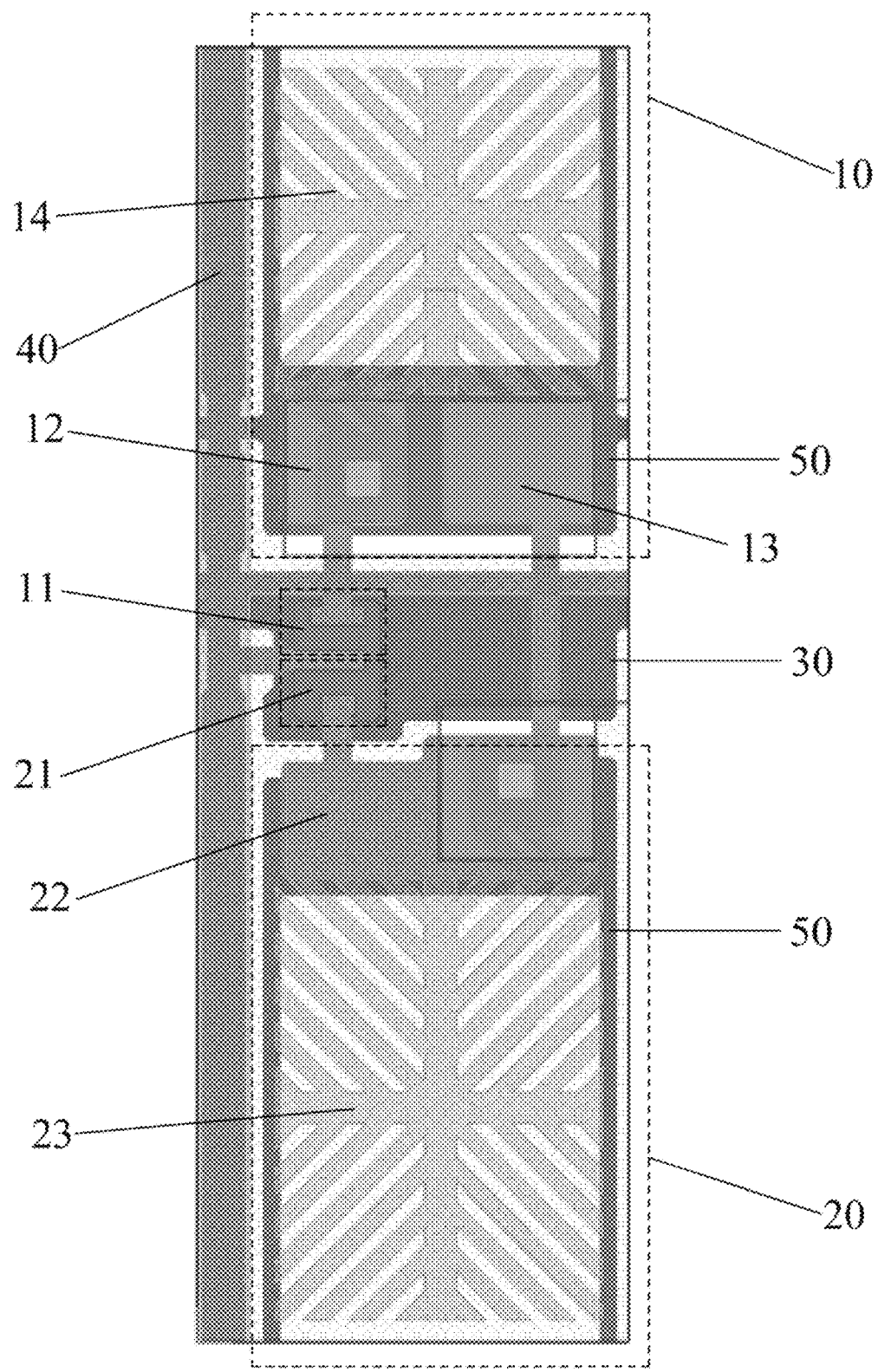
FIG. 3 is a schematic view showing the 8-domain pixel structure according to the present invention.

Refer to FIG. 3. The present invention provides an eight-domain (8-domain) pixel structure, comprising: a plurality of sub-pixels arranged in an array in a liquid crystal display (LCD) panel, each sub-pixel being divided into a main area 10 and a sub area 20, a scan line 30 being disposed for each row of sub-pixels, located between the main area 10 and the sub area 20, a data line 40 being disposed for each column of sub-pixel; further comprising: a main area thin film transistor (TFT) 11, a main area storage capacitor, a sub area TFT 21, and a sub area storage capacitor; the main area storage capacitor being formed by a first main area storage electrode 12 in the main area 10 and a corresponding common electrode 50; the sub area storage capacitor being formed by a sub area storage electrode 22 in the sub area 20 with a second main area storage electrode 13 in the main area 10 and the corresponding common electrode 50, the sub area storage electrode 22 and the second main area storage electrode 13 being electrically connected to each other across the scan line 30; the main area TFT 11 having a gate connected to the scan line 30, a source/drain connected to the data line 40, and a drain/source connected to the first main area storage electrode 10 or a pixel electrode 14 of the main area 10; the sub area TFT 21 having a gate connected to the scan line 30, a source/drain connected to the data line 40, and a drain/source connected to the sub area storage electrode 22 or a pixel electrode 23 of the sub area 20.

Figure 2:
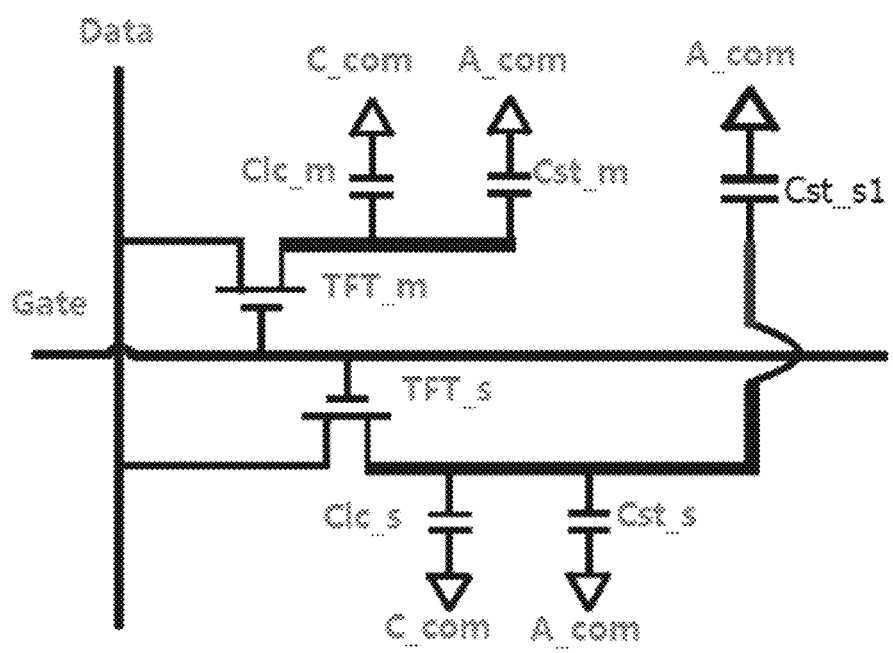
FIG. 2 is a circuit diagram for an 8-domain pixel structure according to the present invention.

Each of the main area 10 and the sub area 20 corresponds to four domains of liquid crystal molecules, respectively. In the manufacturing process, the first main area storage electrode 12 is electrically connected to the pixel electrode 14 of the main area 10 through a via; the sub area storage electrode 22 is electrically connected to the pixel electrode 23 of the sub area 20 through a via. The first main area storage electrode 12, the sub area storage electrode 22 and the second main area storage electrode 13 are manufactured with a same metal layer. The gate of the main area TFT 11, the gate of the sub area TFT 21 and the scan line 30 are manufactured with a same metal layer. The source and drain of the main area TFT 11, the source and drain of the sub area TFT 21, and the data line 40 are manufactured with a same metal layer. The pixel electrode 14 of the main area 10 and the pixel electrode 23 of the sub area 20 are made of indium-tin-oxide (ITO). The pixel structure of the present invention is a PSVA pixel Refer to FIG. 2. FIG. 2 is a circuit diagram of the 8-domain pixel structure. Refer to both FIG. 2 and FIG. 3 for the following description. A plurality of sub-pixels is arranged in an array in a liquid crystal display (LCD) panel, with each sub-pixel being divided into a main area and a sub area, further comprising: a main area TFT TFT_m, a main area liquid crystal (LC) capacitor Clc_m, a main area storage capacitor Cst_m, a sub area TFT TFT_s, a sub area LC capacitor Clc_s, a sub area storage capacitor Cst_s, and a sub area storage capacitor Cst_s1. A scan line Gate is disposed for each row of sub-pixels, and a data line Data is disposed for each column of sub-pixel.

Figure 1:
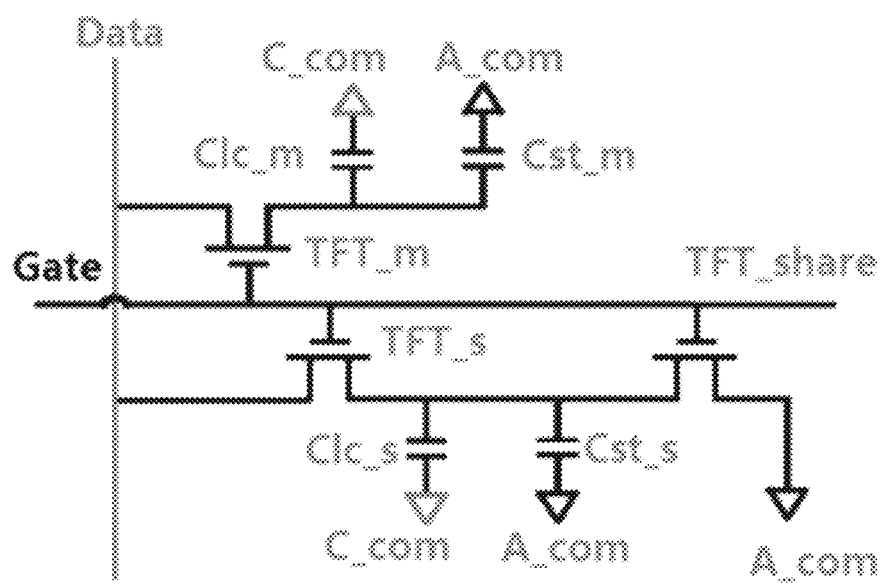
FIG. 1 is a circuit diagram for known 3T pixel structure.

The main area TFT TFT_m has a gate connected to the scan line Gate, a source/drain connected to the data line Data, and the main area LC capacitor Clc_m and the main area storage capacitor Cst_m are connected in parallel between a drain/source and the common voltage A_com (or C_com). The sub area TFT TFT_s has a gate connected to the scan line Gate, a source/drain connected to the data line Data, and the sub area LC capacitor Clc_s, the sub area storage capacitor Cst_s, and the sub area storage capacitor Cst_s1 are connected in parallel between a drain/source and the common voltage A_com (or C_com). The core principle of the present invention is to form the storage capacitor Cst_s1 on the common voltage A_com of the main area by crossing the scan line Gate so that the sub area capacitor has a larger capacitance and relatively reduce the capacitance of the main storage capacitor to achieve controlling the voltage difference between the main and sub areas. Moreover, without forming a path to common electrode A_com for direct discharge as the in the known 3T pixel structure shown in FIG. 1, the problem of best common voltage difference between the main and sub areas does not exist.

In summary, the 8-domain pixel structure provided by the present invention achieves the object of controlling the voltage difference ratio between the main and sub areas by reducing the main area storage capacitor, enlarging the sub area storage capacitor; moreover, without forming a path to common electrode A_com for direct discharge, the problem of best common voltage difference between the main and sub areas does not exist.

Embodiments of the present invention have been described, but not intending to impose any unduly constraint to the appended claims. Any modification of equivalent structure or equivalent process made according to the disclosure and drawings of the present invention, or any application thereof, directly or indirectly, to other related fields of technique, is considered encompassed in the scope of protection defined by the clams of the present invention.

What is claimed is:

1. An eight-domain (8-domain) pixel structure, comprising: a plurality of sub-pixels arranged in an array in a liquid crystal display (LCD) panel, each sub-pixel being divided into a main area and a sub area, a scan line being disposed for each row of sub-pixels, located between the main area and the sub area, a data line being disposed for each column of sub-pixel; further comprising: a main area thin film transistor (TFT), a main area storage capacitor, a sub area TFT, and a sub area storage capacitor; the main area storage capacitor being formed by a first main area storage electrode in the main area and a corresponding common electrode; the sub area storage capacitor being formed by a sub area storage electrode in the sub area with a second main area storage electrode in the main area and the corresponding common electrode, the sub area storage electrode and the second main area storage electrode being electrically connected to each other across the scan line; the main area TFT having a gate connected to a scan line, a source/drain connected to the data line, and a drain/source connected to the first main area storage electrode or a pixel electrode of the main area; the sub area TFT having a gate connected to the scan line, a source/drain connected to the data line, and a drain/source connected to the sub area storage electrode or a pixel electrode of the sub area.

2. The 8-domain pixel structure as claimed in claim 1, wherein the main area and the sub area correspond to four domains of liquid crystal molecules, respectively.

3. The 8-domain pixel structure as claimed in claim 1, wherein the first main area storage electrode is electrically connected to the pixel electrode of the main area through a via.

4. The 8-domain pixel structure as claimed in claim 1, wherein the sub area storage electrode is electrically connected to the pixel electrode of the sub area through a via.

5. The 8-domain pixel structure as claimed in claim 1, wherein the first main area storage electrode, the sub area storage electrode and the second main area storage electrode are manufactured with a same metal layer.

6. The 8-domain pixel structure as claimed in claim 1, wherein the gate of the main area TFT, the gate of the sub area TFT, and the scan line are manufactured with a same metal layer.

7. The 8-domain pixel structure as claimed in claim 1, wherein the source and drain of the main area TFT, the source and drain of the sub area TFT, and the data line are manufactured with a same metal layer.

8. The 8-domain pixel structure as claimed in claim 1, wherein the pixel electrodes of the main area and the sub area are made of indium-tin-oxide (ITO).

9. The 8-domain pixel structure as claimed in claim 1, wherein the pixel is a PSVA pixel.

10. An eight-domain (8-domain) pixel structure, comprising: a plurality of sub-pixels arranged in an array in a liquid crystal display (LCD) panel, each sub-pixel being divided into a main area and a sub area, a scan line being disposed for each row of sub-pixels, located between the main area and the sub area, a data line being disposed for each column of sub-pixel; further comprising: a main area thin film transistor (TFT), a main area storage capacitor, a sub area TFT, and a sub area storage capacitor; the main area storage capacitor being formed by a first main area storage electrode in the main area and a corresponding common electrode; the sub area storage capacitor being formed by a sub area storage electrode in the sub area with a second main area storage electrode in the main area and the corresponding common electrode, the sub area storage electrode and the second main area storage electrode being electrically connected to each other across the scan line; the main area TFT having a gate connected to the scan line, a source/drain connected to the data line, and a drain/source connected to the first main area storage electrode or a pixel electrode of the main area; the sub area TFT having a gate connected to the scan line, a source/drain connected to the data line, and a drain/source connected to the sub area storage electrode or a pixel electrode of the sub area;

wherein the main area and the sub area corresponding to four domains of liquid crystal molecules, respectively;

wherein the first main area storage electrode being electrically connected to the pixel electrode of the main area through a via.

11. The 8-domain pixel structure as claimed in claim 10, wherein the sub area storage electrode is electrically connected to the pixel electrode of the sub area through a via.

12. The 8-domain pixel structure as claimed in claim 10, wherein the first main area storage electrode, the sub area storage electrode and the second main area storage electrode are manufactured with a same metal layer.

13. The 8-domain pixel structure as claimed in claim 10, wherein the gate of the main area TFT, the gate of the sub area TFT, and the scan line are manufactured with a same metal layer.

14. The 8-domain pixel structure as claimed in claim 10, wherein the source and drain of the main area TFT, the source and drain of the sub area TFT, and the data line are manufactured with a same metal layer.

15. The 8-domain pixel structure as claimed in claim 10, wherein the pixel electrodes of the main area and the sub area are made of indium-tin-oxide (ITO).

16. The 8-domain pixel structure as claimed in claim 10, wherein the pixel is a PSVA pixel.

* * * * *